(12) United States Patent
Taniguchi

(10) Patent No.: US 6,445,226 B2
(45) Date of Patent: Sep. 3, 2002

(54) OUTPUT CIRCUIT CONVERTING AN INTERNAL POWER SUPPLY POTENTIAL INTO AN EXTERNAL SUPPLY POTENTIAL IN A SEMICONDUCTOR APPARATUS

(75) Inventor: Kazutaka Taniguchi, Kawasaki (JP)

(73) Assignee: NEC Corporation (JP)

( * ) Notice: Subject to any disclaimer, the term of this patent is extended or adjusted under 35 U.S.C. 154(b) by 0 days.

(21) Appl. No.: 09/859,632

(22) Filed: May 17, 2001

(30) Foreign Application Priority Data

May 18, 2000 (JP) ........................................ 2000-147132

(51) Int. Cl.[7] .................................................. H03K 3/00
(52) U.S. Cl. .......................................... 327/112; 327/333
(58) Field of Search ................................. 327/112, 309, 327/318, 319, 321, 322, 328, 333, 427; 326/63, 68, 80, 81, 82, 83, 86

(56) References Cited

U.S. PATENT DOCUMENTS 5,644,265 A * 7/1997 Austin et al. ................ 327/333
5,929,656 A * 7/1999 Pagones ....................... 326/83
6,075,401 A * 6/2000 Inoue et al. ................. 327/427
6,242,962 B1 * 6/2001 Nakamura ................... 327/333
6,307,421 B1 * 10/2001 Kawano et al. ............. 327/398
6,323,704 B1 * 11/2001 Pelley et al. ................ 327/112

FOREIGN PATENT DOCUMENTS

JP          06-046360          2/1994         ............ H04N/5/70

* cited by examiner

*Primary Examiner*—My-Trang Nuton
(74) *Attorney, Agent, or Firm*—Hayes Soloway, P.C.

(57) ABSTRACT

A three-state buffer circuit has a pull-up side transistor and a pull-down side transistor connected in series between an external power supply potential and a grounding voltage. An output signal is outputted from a node between the pull-up and pull-down transistors. A first level shift circuit is connected to a gate of the pull-up side transistor, and a voltage of a data signal is converted from an internal power supply potential lower than an external power supply potential to the external power supply potential. A second level shift circuit is connected to a gate of the pull-down side transistor, and a voltage of a data signal is converted from the internal power supply potential to the external power supply potential.

8 Claims, 2 Drawing Sheets

OUTPUT CIRCUIT CONVERTING AN INTERNAL POWER SUPPLY POTENTIAL INTO AN EXTERNAL SUPPLY POTENTIAL IN A SEMICONDUCTOR APPARATUS

BACKGROUND OF THE INVENTION

1. Field of the Invention

The present invention relates to an output circuit for converting an internal power supply potential into an external power supply potential in a semiconductor apparatus such as a semiconductor storage device using the internal power supply potential at which the external power supply potential is voltage reduced. In particular, the present invention relates to an output circuit for the purpose of speedy voltage conversion and prevention of a penetration current.

2. Description of the Related Art

In recent years, in a semiconductor storage device, with advancement of fineness, the withstand voltage of a cell transistor configuring the semiconductor storage device is reduced. Because of this, there has been developed a semiconductor storage device that incorporates a voltage reducing circuit in a chip to reduce an external power supply voltage to an allowable transistor withstand voltage, and that uses this voltage as an internal power supply potential for driving the cell transistor. In this case, with respect to an output of the semiconductor storage device, it is require to convert the voltage from an internal power supply voltage to an external power supply voltage in an output circuit in order to output specification. The output circuit itself uses an external power supply potential at which a voltage is not reduced.

Recently, a difference between the internal power supply potential and the external power supply potential increases, and a delay in voltage level conversion becomes an obstacle in speedy conversion. In addition, a penetration current flows at a level converting portion, causing an increase in current consumption.

Conventionally, in an EL (electro luminescence) display panel driving circuit, in order to reduce power consumption, there has been disclosed an output stage circuit in which an auxiliary level shift circuitry is disposed at a previous stage of a level shift circuitry for driving an output transistor that consists of a p-channel transistor and an n-channel transistor, thereby, even if a grounding potential at a high voltage power supply side fluctuates, making it possible to avoid an incorrect drive of the level shift circuitry at the high voltage power supply side and to avoid an unwanted penetration current in an output transistor (Japanese Patent Application Laid-open No. 6-46360).

However, the output stage circuit described in this publication is such that a reference potential line is separated into an input side grounding wire GND 1 and an output side grounding wire GND 2 in order to prevent an unclear grounding potential that corresponds to a low level of an input signal IN as a result of a level shift output voltage of an EL display panel driving circuit being returned to an input side. In this case, unlike a case of a semiconductor storage device such as DRAM, a technique described in the publication could not be applied intact to prevent a penetration current of a semiconductor storage device, and a read/write speed could not be reduced in the prior art.

SUMMARY OF THE INVENTION

It is an object of the present invention to provide an output circuit capable of reading and writing at a high speed data on semiconductor storage device with the advancement of fineness and the achievement of a low voltage of an internal power supply potential, the output circuit being capable of preventing a penetration current and significantly reducing current consumption.

According to one aspect of the present invention, there is provided an output circuit comprising:

a three-state buffer circuit having a pull-up side transistor and a pull-down side transistor connected in series between an external power supply potential and a grounding voltage;

an output terminal connected to a node between the pull-up side transistor and the pull-down side transistor buffer circuit;, a first level shift circuitry connected to a gate of the pull-up side transistor, the first level shift circuitry converting a voltage of an input signal from an internal power supply potential lower than the external power supply potential to the external power supply potential;

a second level shift circuitry connected to a gate of the pull-down side transistor, the second level shift circuitry converting a voltage of an input signal from the internal power supply potential to the external power supply potential;

a signal change detecting circuit for detecting a change of the input signal; and a delay circuitry for delaying an output signal of this signal change detecting circuit to output to the first and second level shift circuitry a signal; for controlling an output of an output circuit to be active or inactive, wherein, when the control signal is in a first state, either one of the pull-up side transistor and pull-down side transistor is turned OFF, causing the output terminal to enter a high impedance, and when the control signal is in a second state, a signal according to "high" or "low" of the input signal is outputted to the output terminal.

According to another aspect of the present invention, there is provided an output circuit comprising:

a three-state buffer circuit having a pull-up side transistor and a pull-down side transistor connected in series between an external power supply potential and a grounding voltage;

an output terminal connected to a node between the pull-up side transistor and the pull-down side transistor;

a first level shift circuitry connected to a gate of the pull-up side transistor, the first level shift circuitry converting a voltage of a data signal from an internal power supply potential lower than the external power supply potential to the external supply potential;

a second level shift circuitry connected to a gate of side pull-down side transistor, the second level shift circuitry converting a voltage of the data signal from an internal power supply potential to the external power supply potential;

a signal change detecting circuit for detecting a change of the data signal;

a delay circuitry for delaying an output signal of this signal change detecting circuit to output to the first and second level shift circuitry a signal for controlling an output of an output circuit to be active or inactive;

a NAND circuit to which the data signal and the control signal are inputted;

an NOR circuit to which the data signal and an inverting signal of the control signal are inputted; and an inverter connected between an output end of the second level shift circuitry and a gate of the pull-down side transistor, wherein, when the control signal is in a first state, either one of the pull-up side transistor and pull-down side transistor is turned OFF, causing the output terminal to enter a high impedance, and when the control signal is in a second state, a signal according to "high" or "low" of the input signal is outputted to the output terminal.

In this case, the output circuit can be configured so that the first level shift circuitry comprises:
a first node to which an inverting signal of an output signal of the NAND circuit;
a second node connected to a gate of the pull-down side transistor;
a second conductive MOS second transistor connected between the external power supply potential and the third node; and
a second conductive MOS third transistor and a first conductive MOS fourth transistor connected in series between the external power supply potential and a grounding potential, wherein the internal power supply potential is provided to a gate of the first transistor, the second node is connected to a gate of the second transistor, the third node is connected to a gate of the third transistor, the second node is connected to a connection point between the third transistor and the fourth transistor, and the second level shift circuitry comprises:
a fourth node to which an output signal of the NOR circuit is inputted;
a fifth node connected to the inverter;
a sixth node;
a first conductive MOS fifth transistor connected between the fourth node and the sixth node;
a second conductive MOS sixth transistor connected between an external power supply potential and the sixth node;
a second conductive MOS seventh transistor and a first conductive MOS eighth transistor connected in series between the external power supply potential and a grounding potential, wherein an internal power supply potential is provided to a gate of the fifth transistor, the fifth node is connected to a gate of the sixth transistor, the sixth node is connected to a gate of the seventh transistor, the fourth node is connected to a gate of the eighth transistor, and the fifth node is connected to a connection point between the seventh transistor and the eighth transistor.

In addition, the output circuit can be configured so that the first level shift circuitry comprises:
a second conductive MOS first transistor and a first conductive MOS second transistor connected in series between the external power supply potential and a grounding potential;
a second conductive MOS third transistor and a first conductive MOS fourth transistor connected in series between the external power supply potential and the grounding potential;
a first node to which an output signal of the NAND circuit is inputted;
a second node connected to a gate of the pull-up side transistor, the second node being connected to a connection point between the third transistor and the fourth transistor:
a third node connected to a connection point between the first transistor and the second transistor; and
a second inverter connected between the first node and gate of the fourth gate transistor, wherein the first node is connected to a gate of the second transistor, and the second level shift circuitry comprises:
a second conductive MOS fifth transistor and a first conductive MOS sixth transistor connected in series between the external power supply potential and the grounding potential;
a second conductive MOS seventh transistor and a first conductive MOS eighth transistor connected in series between the external power supply potential and the grounding potential;
a fourth node to which an output signal of the NOR circuit is inputted;
a fifth node connected to the inverter, the fifth node being connected to a connection point between the seventh transistor and the eighth transistor;
a sixth node connected to a connection point between the fifth transistor and the sixth transistor; and
a third inverter connected between the fourth node and a gate of the sixth transistor, wherein the fourth node is connected to a gate of the eighth transistor.

In the present invention, a level shift circuitry is incorporated in an output circuit in order to eliminate the penetration current during level conversion that is a disadvantage of the prior art. In general, the level shift circuitry is characterized in that a L (low) output is quick, and a H (high) output is slow. Thus, the level shift circuitry is disposed so that DOUT enters a high impedance when a level shift output is slow (H). Further, while in a read state, when read operation starts after an address has been changed, a DOUT circuit is temporarily set to be inactive before readout data is outputted from a memory cell. Then, the readout data is determined, and at the same time, DOUT is controlled so as to be active, thereby making it possible to prevent both of the output transistors from turning ON at the same time, and further, making it possible to cause operation at a high speed.

DETAILED DESCRIPTION OF THE PREFERRED EMBODIMENT

Figure 1:
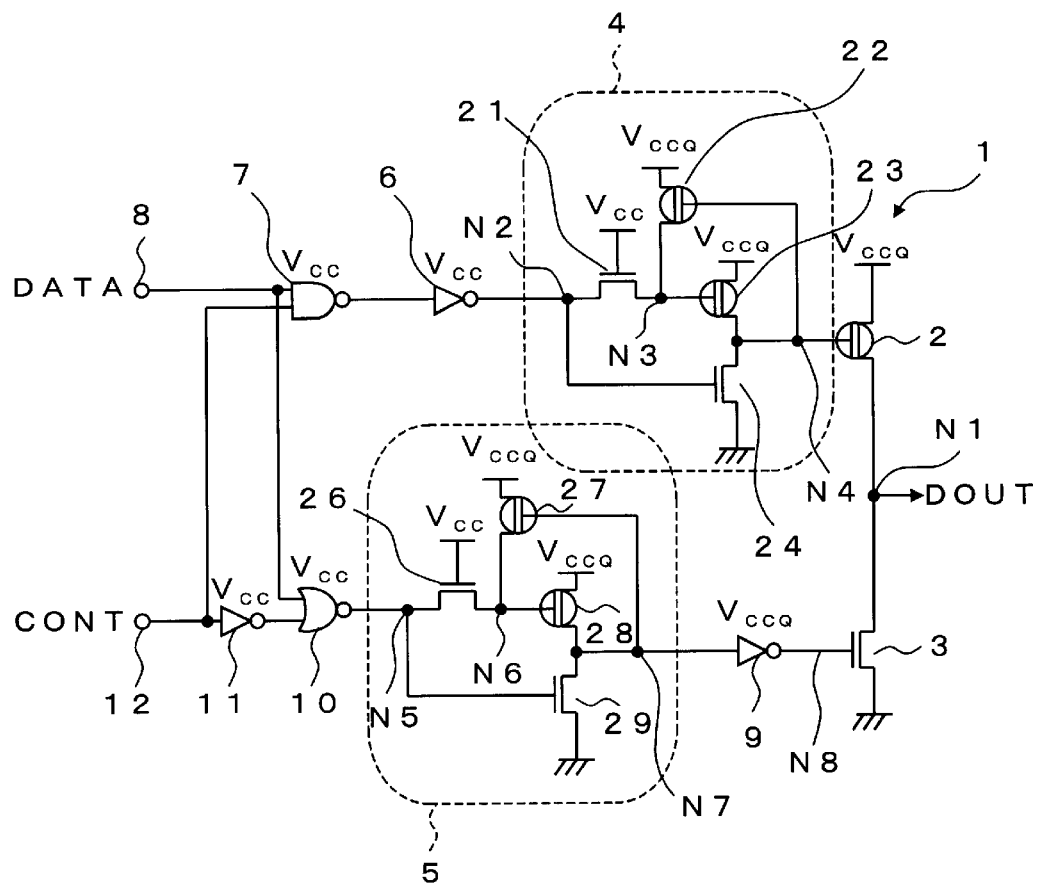
FIG. 1 is a circuit diagram depicting an output circuit according to a first embodiment of the present invention.
Figure 2:
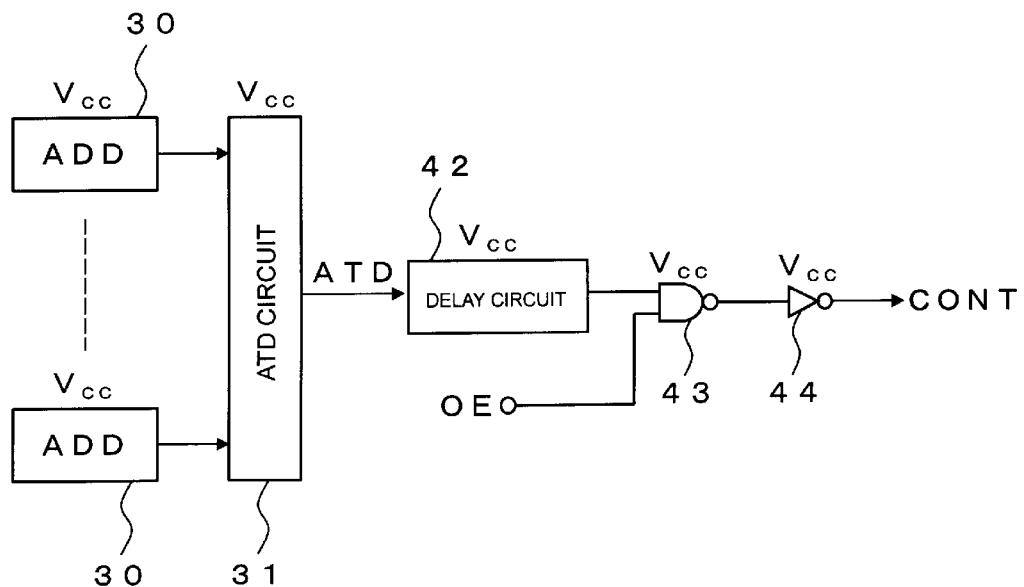
FIG. 2 is a circuit diagram depicting a control circuit according to the first embodiment.
Figure 3:
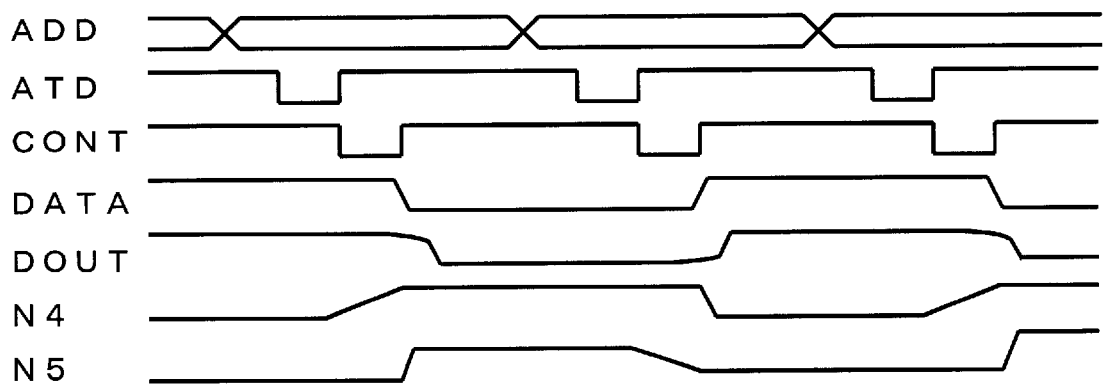
FIG. 3 is a timing chart showing each signal according to the first embodiment.

Hereinafter, preferred embodiments of the present invention will be described in detail with reference to the accompanying drawings. FIG. 1 is a circuit diagram depicting an output circuit according to a first embodiment of the present invention. FIG. 2 is a circuit diagram depicting a control circuit for generating a control signal of the output circuit. FIG. 3 is a timing chart showing an operation of the control circuit. As shown in FIG. 1, the output circuit according to the first embodiment has a three-state buffer circuit 1 at an output stage. This three-state buffer circuit 1 is configured so that a p-channel MOS transistor 2 having an external power source potential VCCQ supplied to its source and an n-channel MOS transistor 3 having its drain grounded thereon are connected in series. From an node N1 between these transistors 2 and 3, an output DOUT of the three-state buffer circuit 1 is outputted.

An output of a first level shift circuitry 4 is inputted to a gate of this transistor 2, and an output of a second level shift circuitry 5 is inputted to a gate of the transistor 3 via an inverter 9.

An input terminal 8 of the readout data DATA from a memory cell is connected to one input end of a NAND circuit 7 and one input end of a NOR circuit 10. In addition, a control signal CONT for controlling this output circuit is inputted to an input terminal 12, and this input terminal 12 is connected to an inverter 11 and the other input end of the NAND circuit 7. The output end of the inverter 11 is connected to the other input end of the NOR circuit 10. An output signal of the NAND circuit 7 is inputted to a first level shift circuitry 4 via an inverter 6, and an output signal of the NOR circuit 10 is inputted to a second level shift circuitry 5. These inverters 6 and 11, NAND circuit 7, and NOR circuit are driven by an internal power supply potential VCC (internal voltage reducing potential). On the other hand, the inverter 9 is driven by an external power supply potential VCCQ. In this case, the relationship is VCC<VCCQ.

The first level shift circuitry 4 and the second level shift circuitry 5 each have the same circuit configuration. That is, an n-channel MOS transistor 21 is connected between an input node N2 of the first level shift circuitry 4 and an internal node N3, and an internal power supply potential VCC is provided to a gate of this transistor 21. In addition, a p-channel MOS transistor 22 is connected between an external power supply potential VCCQ and the node N3, and a gate of the transistor 22 is connected to an output node N4. In addition a p-channel MOS transistor 23 is connected between an external power supply potential VCcQ and the node N4, and an n-channel MOS transistor 24 is connected between the node N4 and a ground. A gate of the transistor 23 is connected to the node N3, and a gate of the transistor 24 is connected to the node N2.

Similarly, in the second level shift circuitry 5, between an input node N5 (input node N2 of the first level shift circuitry 4: hereinafter, the elements corresponding to the first level shift circuitry are enclosed within parentheses) and an output node N7 (output node 4), an n-channel MOS transistor 26 (transistor 21), a p-channel MOS transistor 27 (transistor 22), a p-channel MOS transistor 28 (transistor 23), and an n-channel MOS transistor 29 (transistor 24) are connected via an internal node N6 (internal mode 3). In this way, the level shift circuitry 4 and level shift circuitry 5 for converting a signal voltage from VCC to VCCQ are provided at both of the pull-up side and pull-down side of the three-state buffer circuit 1. However, at the pull-up side of the three-state buffer circuit 1, a level shift circuitry 4 is disposed immediately preceding a pull-up output transistor 2. At the pull-down side, the level shift circuitry 5 is disposed by two stage preceding the output transistor 3 so that an output DOUT of the output circuit is turned OFF when its output is set to H.

On the other hand, a control signal CONT of the output circuit is generated by means of a control circuit shown in FIG. 2. A change of an address (ADD) 30 inputted to an address buffer or the like is detected by means of an address signal change detecting circuit (hereinafter, referred to as an ATD circuitry) 31. An output signal of the ATD circuitry 31 is delayed by means of a delay circuitry 42, and then, is inputted to one input end of a NAND circuit 43. An external input signal OE is inputted to the other input end of the NAND circuit 43. An output of this NAND circuit 43 is inverted via an inverter 44, and then, a control signal CONT is outputted to an input terminal 12. The buffers of these addresses 30 or the like, ATD circuitry 31, delay circuitry 42, NAND circuit 43, and inverter 44 are driven by means of the internal power supply potential VCC.

In this way, a signal CONT for controlling an output DOUT of the output circuit to be active or inactive is composed of an ATD circuitry for detecting an address change and an external input signal OE. After the address has been changed, a timing is adjusted by means of the delay circuitry 42 so that a readout time coincides with a time for activating DOUT.

Now, an operation of the output circuit configured as described above will be described here. First, an operation of the level shift circuitry will be described by way of example of the first level shift circuitry 4 shown in FIG. 1. When a node N2 is set to L (low), anode N3 is set to L, and a p-channel MOS transistor 23 is turned ON. Then, an n-channel MOS transistor 24 is turned OFF, and thus, the node 4 is set to H (high) of the VCCQ level. Therefore, the p-channel MOS transistor 22 is fully turned OFF, and thus, DC based penetration current does not flow.

In this state, when the node N2 is set to H (VCC level), the n-channel MOS transistor 24 is turned ON. At this time, although the node N3 is set to VCC level, the p-channel MOS transistor 23 is not fully turned OFF because its power supply is set to VCCQ, which is higher than a gate voltage (voltage of the node N3). In this state, the current capacity of the n-channel MOS transistor 24 is set so as to be sufficiently higher than that of the p-channel MOS transistor 23, and thus, the node N4 is set to L. Then, the p-channel MOS transistor 22 is turned ON to increase the node N3 to a VCCQ level. As a result, the p-channel MOS transistor 23 is fully turned OFF, and a DC based penetration current does not flow.

In addition, an internal power supply potential VCC is applied to a gate of the n-channel MOS transistor 21, the node N2 is set to VCC, and the node N3 is set to VCCQ. Thus, the n-channel MOS transistor 21 is turned OFF, and the penetration current does not flow. When the node N2 is set to L, the n-channel MOS transistor 24 is turned OFF. The node N3 is set to L because the p-channel MOS transistor has its small current capacity, p-channel MOS transistor 23 is turned ON, and the node N4 is set to H, i.e., the VCCQ level. This H, i.e., VCCQ level is inputted to a gate of the p-channel MOS transistor 22. Thus, this transistor 22 is turned OFF, and the penetration current does not flow.

The second level shift circuitry 5 operates in the same manner as the first level shift circuitry 4 as well. In this way, in the level shift circuitry 4 and level shift circuitry 5, a voltage level can be converted from VCC to VCCQ without supplying the DC-based penetration current.

As has been described previously, the current capacity of the n-channel MOS transistor 24 is set so as to be sufficiently high as compared with the p-channel MOS transistor 23. Thus, an output of the level shift circuitry 4 is characterized in that the output falls at L fast, and rises at H slowly. Therefore, as shown in FIG. 1, when the level shift circuitry 4 and level shift circuitry 5 are disposed, these circuits operate slowly when the output DOUT enters a high impedance, and when output generates data H or L, the circuits operate at a high speed.

As shown in the timing chart of FIG. 3, when readout operation starts after an address has been changed, an ATD circuitry 31 detects an address change and generates a one-shot signal. Then, a control signal CONT is set to L (low). A time for the control signal CONT to rise up to H is adjusted by means of the delay circuitry 42 so as to coincide with a time for the data DATA read out from a memory cell to be transmitted to an input terminal 8 of the output circuit.

If the control signal CONT is set to L, when the immediately preceding readout state is set to H (the first and third falls of CONT shown in FIG. 3), an output of a BAND circuit 7 is set to H; a node N2 is set to L; and a node N4 is slowly set to H. Then, a pull-up output transistor 2 is turned OFF, and an output DOUT of the output circuit enters a high impedance state. In addition, when the immediately preceding readout state i s L (the second fall of CONT shown in FIG. 3), a node N5 is set to L; the node N3 is slowly set to H; and the node N4 is set to L. Then, the pull-down transistor 3 is turned OFF, and the output DOUT of the node Ni of the output circuit enters a high impedance state.

When readout data is transmitted to the data DATA input terminal 8, the control signal CONT is set to H. When data DATA is set to H (the second fall of CONT shown in FIG. 3), an output of the NAND circuit 7 is set to L; the node N2 is set to H; and the node N4 is quickly set to L. Then, the data H is outputted as an output DOUT to the node N1. In this case, the node N5, the node N6, and an output node N8 of the inverter 9 do not change. When data DATA is set to L (the first and third falls of CONT shown in FIG. 3), an output of the NAND7 and the nodes N2 and N4 do not change. Then, the node N5 is set to H, the node N7 is quickly set to L, the node N8 is set to H, and L is set as an output DOUT to the node N1.

Figure 4:
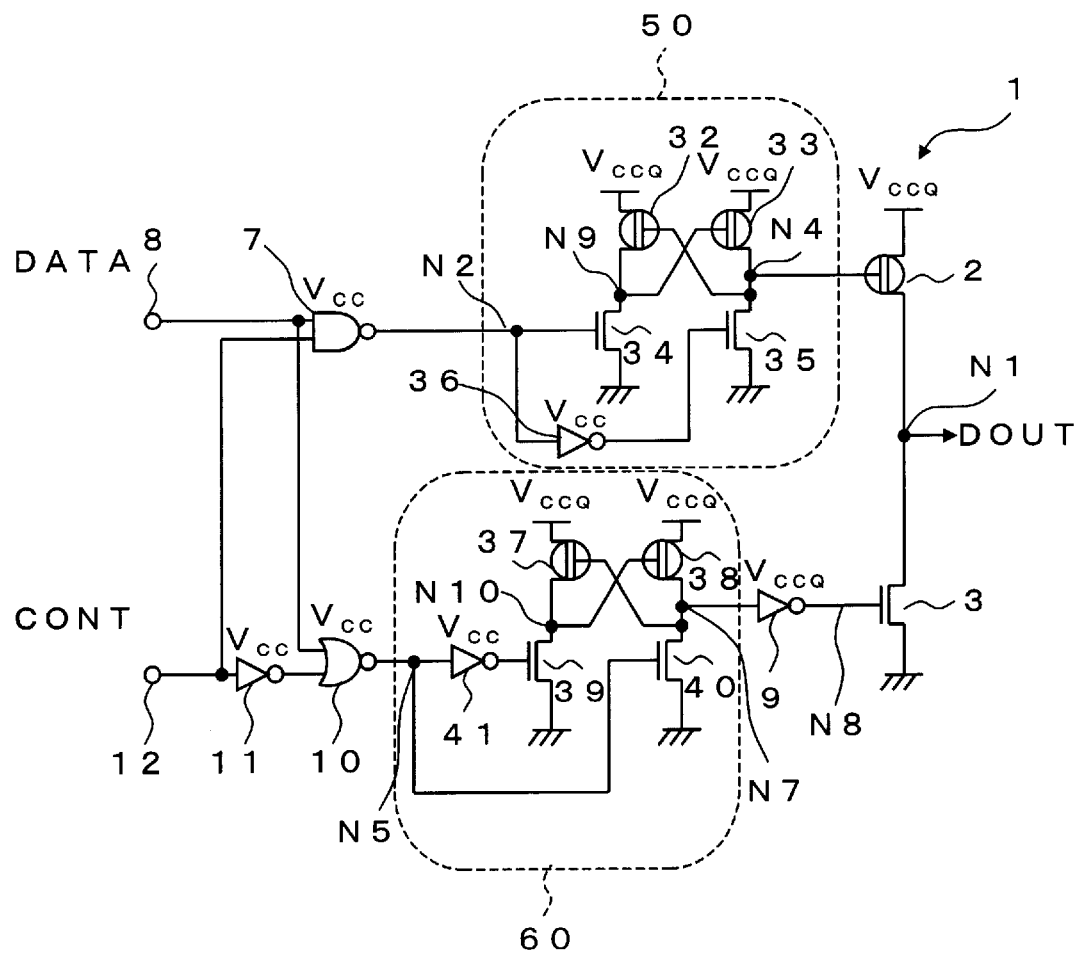
FIG. 4 is a circuit diagram depicting an output circuit according to a second embodiment of the present invention.

Now, a second embodiment of the present invention will be described here. FIG. 4 is a circuit diagram depicting the second embodiment of the present invention. In the present embodiment, a level shift circuitry of an output circuit portion is changed in configuration relevant to the first embodiment shown in FIG. 1.

In the output circuit of the present embodiment as well, as in the first embodiment, although a level shift circuitry 50 and a level shift circuitry 60 are provided at the previous stage of the three-state buffer circuit 1 at the output stage of the output circuit, these level shift circuitry 50 and level shift circuitry 60 are different from the level shift circuitry 4 and level shift circuitry 5 according to the first embodiment in, configuration. However, in the present embodiment, an inverter 6 is not provided.

A level shift circuitry 50 is provided at a gate of the pull-up side transistor 2, and a level shift circuitry 60 is connected to an input stage of the inverter 9 connected to a gate of the pull-down side transistor 3. In the level shift circuitry 50, between an external power supply potential VCCQ and a ground, two pair of serial connection bodies between each of the p-channel MOS transistors 32 and 33 and each of the n-channel MOS transistors 34 and 35 are connected in parallel. The input node N2 of the level shift circuitry 5O is connected to a gate of the transistor 34, and is connected to a gate of the transistor 35 via an inverter 36. A node N9 between the transistor 32 and the transistor 34 is connected to a gate of the transistor 33, and a node N4 (output node of the level shift circuitry 50) between the transistor 33 and the transistor 35 is connected to a gate of the transistor 32. This output node N4 is connected to a gate of the pull-up side transistor 2 of the three-state buffer circuit 1. In addition, an input node N2 of the level shift circuitry 50 is connected to the NAND circuit 7.

On the other hand, in the level shift circuitry 60, between the external power supply potential VCCQ and the grounding potential, two pairs of serial connection bodies between each of the p-channel transistors 37 and 38 and each of the n-channel transistors 39 and 40 are connected in parallel. An input node N5 of the level shift circuitry 60 is inputted to a gate of the transistor 39 via an inverter 41, and is directly connected to a gate of the transistor 40. A node N10 between the transistor 37 and the transistor 39 is connected to a gate of the transistor 38, and a node N7 (output node of the level shift circuitry 60) between the transistor 38 and the transistor 40 is connected to a gate of the transistor 37.

Now, an operation of an output circuit according to a second embodiment, the output circuit being configured as described above, will be described here. When a node N9 is set to H (VCC level), an N channel transistor 34 is turned ON. When the node N9 is set to level L, a p-channel transistor 33 is turned ON. An n-channel transistor 35 is turned OFF because the node N2 is set to L. Thus, the node N4 is set to H (VCCQ level), and the p-channel transistor 32 is turned OFF. Therefore, the penetration current does not flow in the level shift circuitry.

On the other hand, when the node N2 is changed to L, the n-channel transistor 34 is turned OFF, and H, i.e., the VCC level is provided to a gate of the n:channel transistor 35. At this time, although the p-channel transistor 33 is still turned ON, the n-channel transistor 35 is set so as to have sufficiently high current capacity as compared with the p-channel transistor 33. Thus, the node N4 is set to level L. Then, the p-channel transistor 32 is turned ON, the node N9 is set to level H, i.e., VCCQ, and the p-channel transistor 33 is turned OFF. Thus, a DC based penetration current does not flow.

In this level shift circuitry as well, the n-channel transistors 34 and 35 are characterized in that an output of the level shift circuitry is slow at H, and is quick at L because they are set to have their sufficiently high current capacitance relevant to the p-channel transistors 32 and 33. Therefore, in the present embodiment as well, as in the first embodiment, an output H is disposed at a position at which the output is turned OFF. In addition, as in the first embodiment, a control signal CONT is controlled, whereby an effect similar to that according to the first embodiment can be achieved.

As has been described above, according to the present invention, there is an effect that a penetration current is eliminated, and current consumption is reduced by providing a level shift circuitry in an output circuit. In addition, a VCCQ voltage is supplied to a gate of the pull-down side n-channel transistor. Thus, in comparison with a conventional case in which only VCC is supplied, the current capacity is enhanced. Thus, there is an effect that a pull-down output transistor size can be reduced, and a chip area is reduced.

Although a level shift circuitry is characterized in that its output is slow at H, and is quick at L, the present invention provide an arrangement such that an output transistor is turned ON when the level shift circuit outputs L. In this case, the output circuit is temporarily inactivated in advance immediately before readout operation. Thus, when output is generated, an H-side output with its low speed has a plenty of time. Therefore, there is an effect that both of the pull-up and pull-down output transistors are not turned ON, and the output circuit operates at a high speed with low current consumption.

What is claimed is:
1. An output circuit comprising:
 a three-state buffer circuit having a pull-up side transistor and a pull-down side transistor connected in series between an external power supply potential and a grounding voltage;

an output terminal connected to a node between the pull-up side transistor and the pull-down side transistor buffer circuit;

a first level shift circuitry connected to a gate of the pull-up side transistor, the first level shift circuitry converting a voltage of an input signal from an internal power supply potential lower than the external power supply potential to the external power supply potential;

a second level shift circuitry connected to a gate of the pull-down side transistor, the second level shift circuitry converting a voltage of a data signal from the internal power supply potential to the external power supply potential;

a signal change detecting circuit for detecting a change of the input signal; and a delay circuitry for delaying an output signal of this signal change detecting circuit to output to the first and second level shift circuitry a signal for controlling an output of an output circuit to be active or inactive, wherein, when the control signal is in a first state, either one of the pull-up side transistor and pull-down side transistor is turned OFF, causing the output terminal to enter a high impedance, and when the control signal is in a second state, a signal according to "high" or "low" of the data signal is outputted to the output terminal.

2. An output circuit comprising:

a three-state buffer circuit having a pull-up side transistor and a pull-down side transistor connected in series between an external power supply potential and a grounding voltage;

an output terminal connected to a node between the pull-up side transistor and the pull-down side transistor;

a first level shift circuitry connected to a gate of the pull-up side transistor, the first level shift circuitry converting a voltage of a data signal from an internal power supply potential lower than the external power supply potential to the external power supply potential;

a second level shift circuitry connected to a gate of said pull-down side transistor, the second level shift circuitry converting a voltage of the data signal from an internal power supply potential to the external power supply potential;

a signal change detecting circuit for detecting a change of the data signal;

a delay circuitry for delaying an output signal of this signal change detecting circuit to output to the first and second level shift circuitry a signal for controlling an output of an output circuit to be active or inactive;

a NAND circuit to which the data signal and the control signal are inputted;

an NOR circuit to which the data signal and an inverting signal of the control signal are inputted; and an inverter connected between an output end of the second level shift circuitry and a gate of the pull-down side transistor, wherein, when the control signal is in a first state, either one of the pull-up side transistor and pull-down side transistor is turned OFF, causing the output terminal to enter a high impedance, and when the control signal is in a second state, a signal according to "high" or "low" of the input signal is outputted to the output terminal.

3. An output circuit according to claim 2, wherein the first level shift circuitry comprises:

a first node to which an inverting signal of an output signal of the NAND circuit;

a second node connected to a gate of the pull-up side transistor;

a third node;

a first conductive MOS first transistor connected between the first node and the third node;

a second conductive MOS second transistor connected between the external power supply potential and the third node; and a second conductive MOS third transistor and a first conductive MOS fourth transistor connected in series between the external power supply potential and a grounding potential, wherein the internal power supply potential is provided to a gate of the first transistor, the second node is connected to a gate of the second transistor, the third node is connected to a gate of the third transistor, the first node is connected to a gate of the fourth transistor, the second node is connected to a connection point between the third transistor and the fourth transistor.

4. An output circuit according to claim 2, wherein the second level shift circuitry comprises:

a fourth node to which an output signal of the NOR circuit is inputted;

a fifth node connected to the inverter;

a sixth node;

a first conductive MOS fifth transistor connected between the fourth node and the sixth node;

a second conductive MOS sixth transistor connected between the external power supply potential and the sixth node;

a second conductive MOS seventh transistor and a first conductive MOS eighth transistor connected in series between the external power supply potential and a grounding potential, wherein the internal power supply potential is provided to a gate of the fifth transistor, the fifth node is connected to a gate of the sixth transistor, the sixth node is connected to a gate of the seventh transistor, the fourth node is connected to a gate of the eighth transistor, and the fifth node is connected to a connection point between the seventh transistor and the eighth transistor.

5. An output circuit according to claim 3, wherein the second level shift circuitry comprises:

a fourth node to which an output signal of the NOR circuit is inputted;

a fifth node connected to the inverter;

a sixth node;

a first conductive MOS fifth transistor connected between the fourth node and the sixth node;

a second conductive MOS sixth transistor connected between the external power supply potential and the sixth node;

a second conductive MOS seventh transistor and a first conductive MOS eighth transistor connected in series between the external power supply potential and a grounding potential, wherein the internal power supply potential is provided to a gate of the fifth transistor, the fifth node is connected to a gate of the sixth transistor, the sixth node is connected to a gate of the seventh transistor, the fourth node is connected to a gate of the eighth transistor, and the fifth node is connected to a connection point between the seventh transistor and the eighth transistor.

6. An output circuit according to claim 2, wherein the first level shift circuitry comprises:

a second conductive MOS first transistor and a first conductive MOS second transistor connected in series between the external power supply potential and a grounding potential;

a second conductive MOS third transistor and a first conductive MOS fourth transistor connected in series between the external power supply potential and the grounding potential;

a first node to which an output signal of the NAND circuit is inputted;

a second node connected to a gate of the pull-up side transistor, the second node being connected to a connection point between the third transistor and the fourth transistor;

a third node connected to a connection point between the first transistor and the second transistor; and a second inverter connected between the first node and gate of the fourth gate transistor, wherein the first node is connected to a gate of the second transistor.

7. An output circuit according to claim 2, wherein the second level shift circuitry comprises:

a second conductive MOS fifth transistor and a first conductive MOS sixth transistor connected in series between the external power supply potential and the grounding potential;

a second conductive MOS seventh transistor and a first conductive MOS eighth transistor connected in series between the external power supply potential and the grounding potential;

a fourth node to which an output signal of the NOR circuit is inputted;

a fifth node connected to the inverter, the fifth node being connected to a connection point between the seventh transistor and the eighth transistor;

a sixth node connected to a connection point between the fifth transistor and the sixth transistor; and a third inverter connected between the fourth node and a gate of the sixth transistor, wherein the fourth node is connected to a gate of the eighth transistor.

8. An output circuit according to claim 6, wherein the second level shift circuitry comprises:

a second conductive MOS fifth transistor and a first conductive MOS sixth transistor connected in series between the external power supply potential and the grounding potential;

a second conductive MOS seventh transistor and a first conductive MOS eighth transistor connected in series between the external power supply potential and the grounding potential;

a fourth node to which an output signal of the NOR circuit is inputted;

a fifth node connected to the inverter, the fifth node being connected to a connection point between the seventh transistor and the eighth transistor;

a sixth node connected to a connection point between the fifth transistor and the sixth transistor; and a third inverter connected between the fourth node and a gate of the sixth transistor, wherein the eighth node is connected to a gate of the eighth transistor.

* * * * *